US008927984B2

(12) United States Patent
Adekore et al.

(10) Patent No.: US 8,927,984 B2
(45) Date of Patent: Jan. 6, 2015

(54) ROTATED CHANNEL SEMICONDUCTOR FIELD EFFECT TRANSISTOR

(71) Applicant: RamGoss, Inc., Boston, MA (US)

(72) Inventors: Bunmi T. Adekore, Boston, MA (US); James Fiorenza, Wilmington, MA (US)

(73) Assignee: RamGoss, Inc., Woburn, MA (US)

( * ) Notice: Subject to any disclaimer, the term of this patent is extended or adjusted under 35 U.S.C. 154(b) by 37 days.

(21) Appl. No.: 13/743,062

(22) Filed: Jan. 16, 2013

(65) Prior Publication Data
US 2013/0181215 A1    Jul. 18, 2013

Related U.S. Application Data

(60) Provisional application No. 61/587,448, filed on Jan. 17, 2012.

(51) Int. Cl.
| | | |
|---|---|---|
| *H01L 29/12* | (2006.01) | |
| *H01L 29/778* | (2006.01) | |
| *H01L 29/66* | (2006.01) | |
| *H01L 27/06* | (2006.01) | |
| *H01L 27/085* | (2006.01) | |
| *H01L 29/20* | (2006.01) | |
| *H01L 29/06* | (2006.01) | |
| *H01L 29/225* | (2006.01) | |

(52) U.S. Cl.
CPC .............. *H01L 29/12* (2013.01); *H01L 29/778* (2013.01); *H01L 29/66477* (2013.01); *H01L 29/66462* (2013.01); *H01L 29/66969* (2013.01); *H01L 29/7786* (2013.01); *H01L 29/7787* (2013.01); *H01L 29/7789* (2013.01); *H01L 27/0605* (2013.01); *H01L 27/085* (2013.01); *H01L 29/2003* (2013.01); *H01L 29/0657* (2013.01); *H01L 29/225* (2013.01)
USPC ............................. 257/43; 257/76; 257/190

(58) Field of Classification Search
USPC ............................................. 257/43, 76, 190
See application file for complete search history.

(56) References Cited

U.S. PATENT DOCUMENTS

| 7,105,868 B2 | 9/2006 | Nause et al. |
|---|---|---|
| 7,598,128 B2 | 10/2009 | Hsu et al. |

(Continued)

FOREIGN PATENT DOCUMENTS

| JP | 2011-061094 | 3/2011 |
|---|---|---|
| KR | 10-2005-0065891 | 6/2005 |

(Continued)

OTHER PUBLICATIONS

International Search Report and Written Opinion issued for PCT/US2013/021744, dated May 30, 2013, 12 pages.

*Primary Examiner* — Tan N Tran
(74) *Attorney, Agent, or Firm* — Wilmer Cutler Pickering Hale and Dorr LLP

(57) ABSTRACT

A transistor device, such as a rotated channel metal oxide/insulator field effect transistor (RC-MO(I)SFET), includes a substrate including a non-polar or semi-polar wide band gap substrate material such as an $Al_2O_3$ or a ZnO or a Group-III Nitride-based material, and a first structure disposed on a first side of the substrate comprising of AlInGaN-based and/or ZnMgO based semiconducting materials. The first structure further includes an intentional current-conducting sidewall channel or facet whereupon additional semiconductor layers, dielectric layers and electrode layers are disposed and upon which the field effect of the dielectric and electrode layers occurs thus allowing for a high density monolithic integration of a multiplicity of discrete devices on a common substrate thereby enabling a higher power density than in conventional lateral power MOSFET devices.

18 Claims, 11 Drawing Sheets

(56) References Cited

U.S. PATENT DOCUMENTS

| | | | |
|---|---|---|---|
| 7,723,154 B1 | 5/2010 | Adekore et al. | |
| 7,829,376 B1 | 11/2010 | Adekore et al. | |
| 8,035,128 B2 | 10/2011 | Ikeda et al. | |
| 8,039,872 B2 | 10/2011 | Otake | |
| 8,329,541 B2 | 12/2012 | Ye et al. | |
| 8,772,829 B2 | 7/2014 | Adekore et al. | |
| 2005/0236642 A1 | 10/2005 | Sakai et al. | |
| 2009/0269879 A1 | 10/2009 | Adekore et al. | |
| 2010/0032008 A1 | 2/2010 | Adekore | |
| 2010/0117070 A1 | 5/2010 | Adekore et al. | |
| 2010/0133529 A1 | 6/2010 | Taraschi et al. | |
| 2011/0133211 A1* | 6/2011 | Malhan et al. | 257/77 |
| 2011/0260780 A1* | 10/2011 | Granger-Jones et al. | 327/537 |
| 2012/0086001 A1* | 4/2012 | Wang | 257/43 |
| 2012/0086049 A1* | 4/2012 | Hwang et al. | 257/194 |
| 2012/0181548 A1* | 7/2012 | Okada et al. | 257/76 |
| 2013/0040431 A1 | 2/2013 | Ye et al. | |

FOREIGN PATENT DOCUMENTS

| | | |
|---|---|---|
| KR | 10-0825815 | 4/2008 |
| WO | WO-2008073469 A1 | 6/2008 |
| WO | WO-2009131842 A1 | 10/2009 |
| WO | WO-2009143226 A1 | 11/2009 |
| WO | WO-2009152207 A2 | 12/2009 |
| WO | WO-2010033792 A1 | 3/2010 |
| WO | WO-2010033910 A1 | 3/2010 |
| WO | WO-2010085754 A1 | 7/2010 |

* cited by examiner

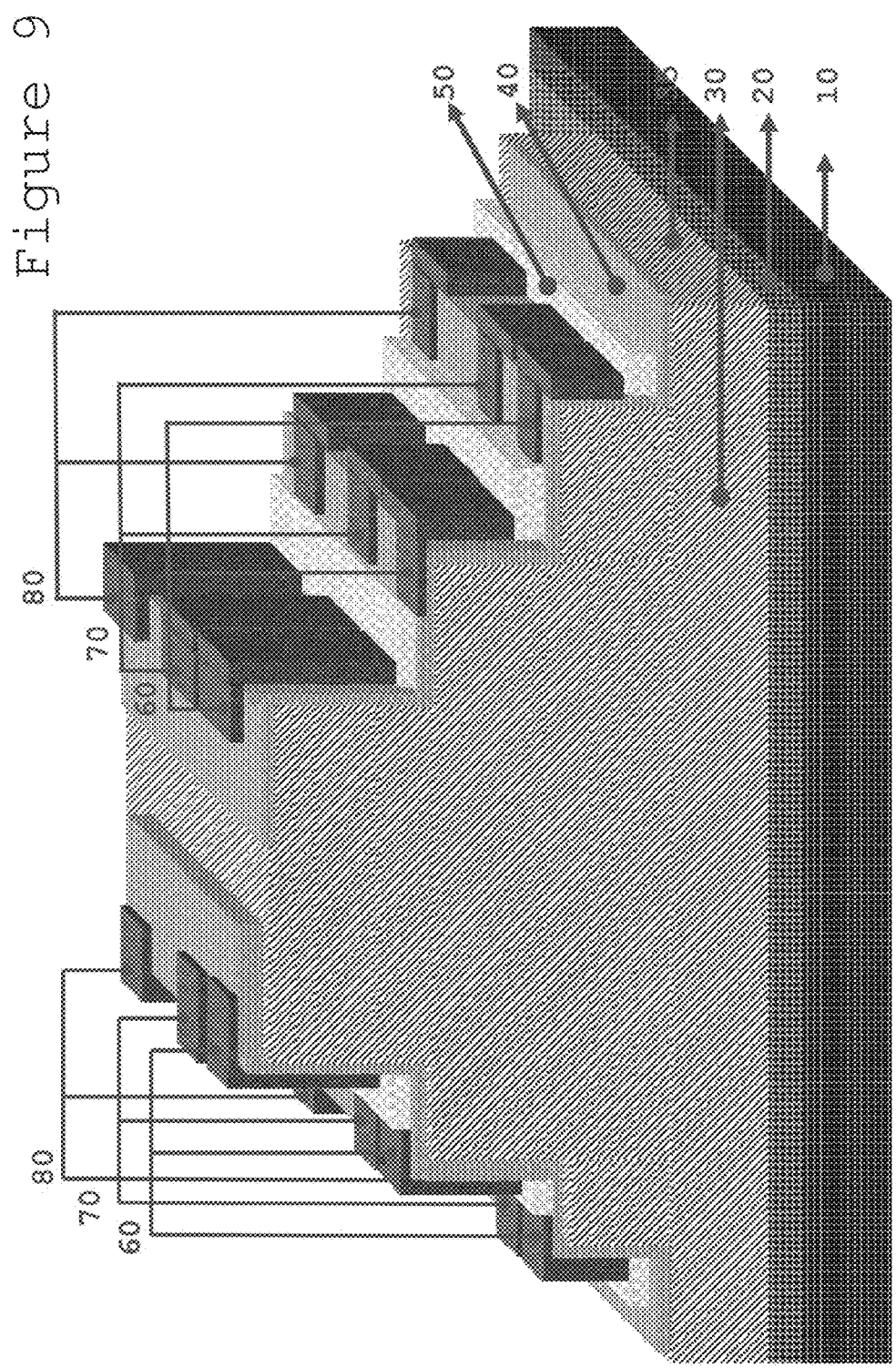

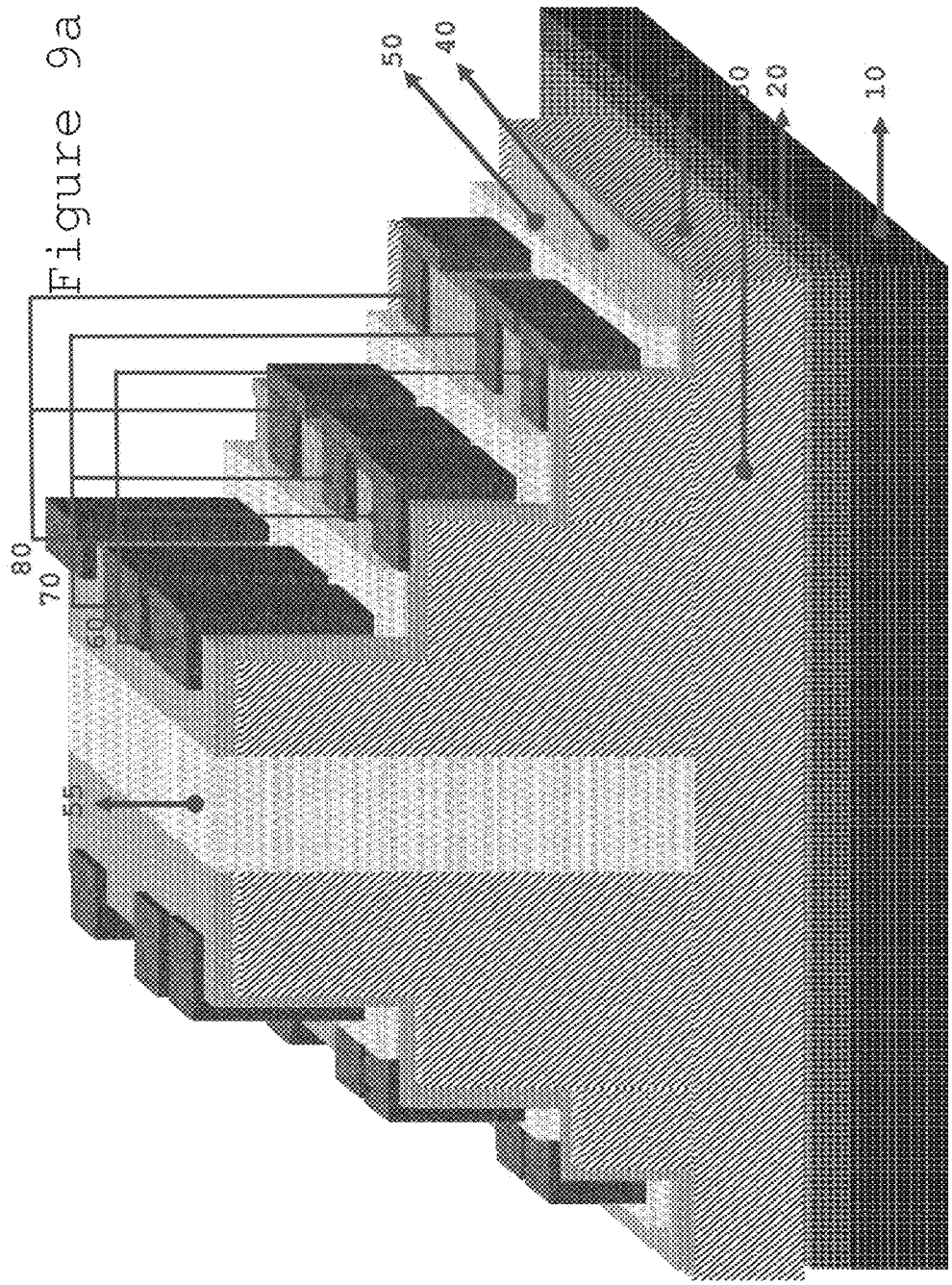

ROTATED CHANNEL SEMICONDUCTOR FIELD EFFECT TRANSISTOR

CROSS-REFERENCE TO RELATED APPLICATIONS

This application claims benefit of the earlier filing date of U.S. Provisional Patent Application No. 61/587,448, entitled "HIGH INTEGRATION ROTATED CHANNEL SEMICONDUCTOR FIELD EFFECT TRANSISTOR," filed on Jan. 17, 2012. The provisional patent application is hereby incorporated by reference herein in its entirety. All patents, patent applications and publications cited herein are hereby incorporated by reference in their entirety in order to more fully describe the state of the art as known to those skilled therein as of the date of the invention described herein.

FIELD OF DISCLOSURE

The disclosed apparatus and method relate generally to junction and metal oxide/insulator field effect transistors and methods of making the same, and more specifically to metal insulator field effect transistors comprising of group-III nitride materials and/or zinc oxide based semiconductor field effect transistors.

BACKGROUND

Lateral metal oxide semiconductor field effect transistors are a unique class of three terminal transistor devices which include source, drain and gate electrode terminals wherein the electric fields sustained between the source and drain is distributed laterally. In silicon-based semiconductor materials, a variant of LMOSFETs known as laterally diffused metal oxide semiconductor field effect transistors (LDMOSFETs) are typically manufactured—the advantages of which include cost-efficacy, and performance advantages around a low defect interface between silicon and silicon dioxide and/or other "high—K" dielectric materials such as hafnium oxide which are materials suspended between the semiconductor and the gate electrode and employed to achieve the transistor field effect. However, silicon based LDMOSFETs have fundamental limits centered on the low critical field of the material defined as the electric field beyond which the material breaks down and losses its semiconductor properties—a direct consequence of the relatively low energy band gap of the material of 1.14 eV; its low switching frequency of below 100 kHz; its high on-resistance of above 200 m$\Omega$-cm$^{-2}$; and its low operating temperatures of about 150° C.

Furthermore, the utility of hybrid hetero-structures comprising of AlInGaN based materials deposited directly onto silicon substrates have costs and performance benefits. The cost benefits arising from the economies of scale stemming from the availability of large surface area silicon substrates—which is historically the most affordable semiconductor substrates as well as well the fully amortized cost of silicon processing equipment. The performance benefits arising from the availability of a two dimensional electron gas (2DEG) at the interfaces of AlInGaN layers semiconductor layers leading to performance benefits such as ultra-low impedances or On-Resistances. However, the defectivity pertinent to these hybrid materials i.e. above $10^6$ cm$^{-2}$ dislocation densities has been posited as a preeminent factor in lower field and voltage rating as well as a contributor to the deleterious density of surface states in AlInGaN/GaN based hybrid materials on silicon based transistors. Moreover, the utility of lower energy gap substrate materials such as silicon can lead to pre-mature breakdown even for AlInGaN/GaN MOSFETs as depletions regions in the off-state may extend into the lower critical field silicon substrate.

Nonetheless, these hybrid materials on silicon have enabled a generation of devices including AlGaN based High Electron Mobility Transistors (HEMTs) and "normally-on" field effect transistors utilizing Schottky gates. Whereas significant effort has been invested in the commercialization of AlGaN based LMO(I)SFETs, the realization of devices which have critical field ratings at about the theoretical field strength of AlInGaN based devices and voltage ratings exceeding breakdown voltages of 800V remains technically challenging and elusive.

A process which enables the placement of high quality AlInGaN based materials i.e with dislocation densities below about $10^7$ cm$^{-2}$ on substrate materials with comparable energy band gap and critical breakdown field strength in conjunction with large surface areas of at least about 50 mm diameter and which relocates the current conducting channel away from orthogonally propagating line and or area defects such as in devices in which the current conducting channel is rotated to occur in the plane of a sidewall of the semiconductor would effectively allow the realization of AlInGaN based transistors which can function at approximately the theoretical critical field anticipated for AlInGaN based materials, at a voltage rating between 800V to 15,000V as well as by pass the deleterious surface state effects of line defects terminating at the nominal planar lateral surface of the semiconductor; and at a levelized cost structure approximately similar to silicon based devices.

Whereas the advent of silicon carbide (SiC) based devices has extended the functionality of power MO(I)SFETs to higher electric fields and thus higher operating voltages of up to 10 kV—essentially due to the higher band gap of the material of 3.0 eV; vertical MOSFET architecture; higher switching frequencies; and higher operating temperatures of about 230° C.; SiC based power transistors are still very expensive and with levelized cost of 50 to 100 times those of their silicon counterparts thus limiting their market adoption; the on-Resistances of SiC based transistors at operating temperatures of interests i.e. above 100° C. are markedly higher i.e about 10-100 times those anticipated for AlInGaN based power transistors as a result of the absence of the high channel mobility in AlInGaN based devices due to the sustained two dimensional electron gas (2DEG) typically formed at the interfaces of AlGaInN semiconductor layers.

SUMMARY

In one aspect, a transistor device comprises a substrate comprising a non-polar or semipolar $Al_2O_3$ or a ZnO or a Group III-Nitride -based material, and a structure disposed on a first side of the substrate, the structure comprising a plurality of semiconductor layers and the semiconductor layers comprising of a plurality of $Al_xGa_{1-x}N$ and/or $AlIn_yGa_{1-y-z}N$ and/or $Zn_xMg_{1-x}O$ materials for value range $0 \leq x < 1$, $0 \leq y < 0.5$, $0 \leq z < 0.5$. The device further comprises of an intentional current-conducting sidewall channel upon which electrode materials are deposited to consist of electrode terminals allowing or inhibiting current flow from a first electrode through the action of a second electrode to a third electrode along the said intentional current-channel sidewall.

In one aspect, a transistor device comprises a substrate comprising a $Al_2O_3$ or a ZnO or a Group III-Nitride -based material, which is n-type, and a structure disposed on a first side of the substrate, the structure comprising a plurality of semiconductor layers and the semiconductor layers comprising of a plurality of $Al_xGa_{1-x}N$ and/or $AlIn_zGa_{1-y-z}N$ and/or $Zn_xMg_{1-x}O$ materials comprising of n-type or p-type species and wherein the n-type or p-type species maybe introduced by one or a plurality of doping techniques including ion-implantation, gas-phase incorporation, solution incorporation and diffusion. The device may further comprises of an intentional current-conducting sidewall channel which maybe formed by wet or solution etching techniques and or by dry etching techniques including reactive ion etching and or inductively coupled plasma reactive ion etching and or selective area deposition. The device may further comprises of at least one dielectric or insulating medium sustained on surface of intentional current-conducting sidewall channel and with metal and or conducting semiconductor material electrodes which may comprise of n-type or p-type species supported on the first of substrate.

In one aspect, a transistor device comprises a substrate comprising a non-polar or semipolar $Al_2O_3$ or a ZnO or a Group III-Nitride -based material, and a structure disposed on a first side of the substrate, the structure comprising a plurality of semiconductor layers and the semiconductor layers comprising of a plurality of $Al_xGa_{1-x}N$ and/or $Al_yIn_zGa_{1-y-z}N$ and/or $Zn_xMg_{1-x}O$ materials for value range $0 \le x<1$, $0 \le y<0.5$, $0 \le z<0.5$. The device further comprises of an intentional current-conducting sidewall channel upon which at least one additional layer of $Al_xGa_{1-x}N$ and/or $Al_yIn_zGa_{1-y-z}N$ and/or $Zn_xMg_{1-x}O$ materials for value range $0 \le x<1$, $0 \le y<0.5$, $0 \le z<0.5$ is sustained on surface of the said intentional current-conducting sidewall channel upon which electrode materials are deposited to consist of electrode terminals which may inhibit current flow from a first electrode through the action of a second electrode to a third electrode along the said intentional current-conducting sidewall channel as a depletion-mode device shown in FIG. 1.

In one aspect, a transistor device comprises a substrate comprising a non-polar or semipolar $Al_2O_3$ or a ZnO or a Group III-Nitride -based material, and a structure disposed on a first side of the substrate, the structure comprising a plurality of semiconductor layers and the semiconductor layers comprising of a plurality of $Al_xGa_{1-x}N$ and/or $Al_yIn_zGa_{1-y-z}N$ and/or $Zn_xMg_{1-x}O$ materials for value range $0 \le x<1$, $0 \le y<0.5$, $0 \le z<0.5$. The device further comprises of an intentional current-conducting sidewall channel upon which at least one additional layer of $Al_xGa_{1-x}N$ and/or $Al_yIn_zGa_{1-y-z}N$ and/or $Zn_xMg_{1-x}O$ materials for value range $0 \le x<1$, $0 \le y<0.5$, $0 \le z<0.5$ maybe sustained in conjunction with at least one dielectric layer on surface of the said intentional current-conducting sidewall channel upon which electrode materials are deposited to consist of electrode terminals which may allow current flow from a first electrode through the action of a second electrode to a third electrode along the said intentional current-conducting sidewall channel as an enhancement-mode device shown in FIG. 2.

In one aspect, an array of transistor devices comprising a first type of transistor device comprising of common non-polar or semi-polar $Al_2O_3$ or a ZnO or a Group III-Nitride -based substrate, and a structure disposed on a first side of the substrate, the structure comprising a plurality of semiconductor layers and the semiconductor layers comprising of a plurality of $Al_xGa_{1-x}N$ and/or $Al_yIn_zGa_{1-y-z}N$ and/or $Zn_xMg_{1-x}O$ materials for value range $0 \le x<1$, $0 \le y<0.5$, $0 \le z<0.5$. The first type devices further comprises of an intentional current-conducting sidewall channel upon which at least one additional layer of $Al_xGa_{1-x}N$ and/or $Al_yIn_zGa_{1-y-z}N$ and/or $Zn_xMg_{1-x}O$ materials for value range $0 \le x<1$, $0 \le y<0.5$, $0 \le z<0.5$ in conjunction with at least one dielectric layer are sustained on surface of the said intentional current-conducting sidewall channel upon which electrode materials are further deposited to consist of electrode terminals allowing or inhibiting current flow from a first electrode through the action of a second electrode to a third electrode along the said intentional current-conducting sidewall channel are linked with a second type of transistor device on the same common substrate, and a structure disposed on a first side of the substrate, the structure comprising a plurality of semiconductor layers and the semiconductor layers comprising of a plurality of $Al_xGa_{1-x}N$ and/or $Al_yIn_zGa_{1-y-z}N$ and/or $Zn_xMg_{1-x}O$ materials for value range $0 \le x<1$, $0 \le y<0.5$, $0 \le z<0.5$. The second type devices further comprises of an intentional current-conducting sidewall channel upon which at least one additional layer of $Al_xGa_{1-x}N$ and/or $Al_yIn_zGa_{1-y-z}N$ and/or $Zn_xMg_{1-x}O$ materials for value range $0 \le x<1$, $0 \le y<0.5$, $0 \le z<0.5$ is sustained on surface of the said intentional current-conducting sidewall channel upon which electrode materials are further deposited to consist of electrode terminals allowing or inhibiting current flow from a first electrode through the action of a second electrode to a third electrode along the said intentional current-conducting sidewall channel and wherein first and second type transistors as well as the posterior extremities maybe separated by a passivating field dielectric and or through an heavy atom implantation region as shown in FIG. 3. The array of transistors may be further fabricated to comprise only of the either types of device such as only an array of enhancement- or depletion-mode devices as shown in FIGS. 4 and 5 respectively and upon which a multiplicity of a combination of arrays of devices maybe further integrated and separated by an isolation layer as shown in FIG. 6.

In one aspect, an array of transistor devices comprising of common non-polar or semi-polar $Al_2O_3$ or a ZnO or a Group III-Nitride-based substrate, and a structure disposed on a first side of the substrate, the structure further comprising of multiplicity of mesas, and the mesas comprising of a multiplicity of intentional current-conducting sidewalls, the mesas comprising a plurality of semiconductor layers and the semiconductor layers comprising of a plurality of $Al_xGa_{1-x}N$ and/or $Al_yIn_zGa_{1-y-z}N$ and/or $Zn_xMg_{1-x}O$ materials for value range $0 \le x<1$, $0 \le y<0.5$, $0 \le z<0.5$. The mesas maybe further engineered to comprise of depletion-mode devices in the similitude of FIG. 1 to form an array as shown in FIG. 8 and wherein the array of devices maybe separated by an isolation layer comprising of a dielectric medium as shown in FIG. 8a or an heavy atom implant region; or the mesas maybe further engineered to comprise of enhancement-mode devices in the similitude of FIG. 2 to form an array and wherein the array of devices maybe separated by an isolation layer comprising of a dielectric medium or heavy atom implant in the similitude of FIGS. 8 and 8a; or the mesas maybe further engineered to comprise of an array of depletion- and enhancement-mode devices and wherein the array of devices maybe separated by an isolation layer comprising of a dielectric medium or heavy atom implant in the similitude of FIGS. 8 and 8a.

In one aspect, an array of transistor devices comprising of common non-polar or semi-polar $Al_2O_3$ or a ZnO or a Group III-Nitride -based substrate, and a structure disposed on a first side of the substrate, the structure further comprising of a terrace of several intentional current-conducting sidewalls, the terraces comprising a plurality of semiconductor layers and the semiconductor layers comprising of a plurality of $Al_xGa_{1-x}N$ and/or $Al_yIn_zGa_{1-y-z}N$ and/or $Zn_xMg_{1-x}O$ materials for value range $0 \le x<1$, $0 \le y<0.5$, $0 \le z<0.5$. The terraces maybe further engineered to comprise of depletion-mode devices in the similitude of FIG. 1 to form an array as shown in FIG. 9 and wherein the array of devices maybe separated by an isolation layer comprising of a dielectric medium or heavy atom implant as shown in FIG. 9a; or the terraces maybe further engineered to comprise of enhancement-mode devices in the similitude of FIG. 2 to form an array and wherein the array of devices maybe separated by an isolation layer comprising of a dielectric medium or heavy atom implant in the similitude of FIGS. 9 and 9a; or the terraces maybe further engineered to comprise of an array of depletion- and enhancement-mode devices and wherein the array of devices maybe separated by an isolation layer comprising of a dielectric medium or heavy atom implant in the similitude of FIGS. 9 and 9a.

Other aspects, embodiments and features of the disclosed apparatus and method will become apparent from the following detailed description when considered in conjunction with the accompanying drawings. The accompanying figures are schematic and are not intended to be drawn to scale. In the figures, each identical, or substantially similar component that is illustrated in various figures is represented by a single numeral or notation. For purposes of clarity, not every component is labeled in every figure. Nor is every component of each embodiment of the disclosed apparatus and method shown where illustration is not necessary to allow those of ordinary skill in the art to understand the disclosed apparatus and method. All patent applications and patents incorporated herein by reference are incorporated by reference in their entirety. In case of conflict, the present specification, including definitions, will control.

Some embodiments describe a semiconductor device. The semiconductor device can include a substrate, a buffering layer disposed above the substrate, and a channel layer having a first portion and a second portion, wherein the first portion has a first thickness and the second portion has a second thickness, and wherein a wall adjoining the first portion and the second portion includes a sidewall channel. The semiconductor device can also include a plurality of electrodes configured to be in electrical communication with the sidewall channel, wherein the plurality of electrodes is configured to receive voltages to provide a controlled current flow through the semiconductor device.

In any of the embodiments described herein, the channel layer can include one or more of $Zn_xMg_{1-x}O$, $Al_xGa_{1-x}N$, and $Al_yIn_zGa_{1-y-z}N$, wherein $0 \leq x \leq 1$, $0 \leq y \leq 0.5$, $0 \leq z \leq 0.5$.

In any of the embodiments described herein, the substrate can include a non-polar or semi-polar semiconductor material.

In any of the embodiments described herein, the non-polar material or semi-polar semiconductor material includes $Al_2O_3$, $ZnO$, or a Group-III Nitride.

In any of the embodiments described herein, the sidewall channel is configured to accommodate a two dimensional electron gas formed by a piezo polarization of the channel layer.

In any of the embodiments described herein, the sidewall channel is substantially perpendicular to the first portion and the second portion of the channel layer.

In any of the embodiments described herein, wherein the sidewall channel is configured to substantially avoid crystalline defects of the channel layer.

In any of the embodiments described herein, wherein the crystalline defects of the channel layer include threading dislocations, and misfit and prismatic dislocations.

In any of the embodiments described herein, the semiconductor device can further include an alloy layer disposed between the channel layer and the plurality of electrodes, wherein the alloy layer is configured to provide control of the sidewall channel's sheet carrier density.

In any of the embodiments described herein, the alloy layer includes a plurality of sub-layers, each sub-layer having a dissimilar concentration of aluminum from other sub-layers.

In any of the embodiments described herein, the alloy layer includes a plurality of sub-layers, each sub-layer having a dissimilar concentration of indium from other sub-layers.

In any of the embodiments described herein, the alloy layer includes $Zn_xMg_{1-x}O$, $Al_xGa_{1-x}N$, or $Al_yIn_zGa_{1-z}N$, wherein $0 \leq x \leq 1$, $0 \leq y \leq 0.5$, $0 \leq z \leq 0.5$.

In any of the embodiments described herein, the buffering layer includes $Zn_xMg_{1-x}O$, wherein $0 \leq x < 1$, $0 \leq y < 0.5$, $0 \leq z < 0.5$.

In any of the embodiments described herein, the semiconductor device can further include an insulating layer disposed between the channel layer and one of the plurality of electrodes.

In any of the embodiments described herein, the channel layer includes a third portion having a third thickness, wherein a second wall adjoining the second portion and the third portion includes a second sidewall channel.

In any of the embodiments described herein, the first thickness and the third thickness are substantially identical.

In any of the embodiments described herein, the first thickness and the third thickness are different.

Some embodiments describe a method for fabricating a semiconductor device. The method can include providing a substrate including a non-polar or semi-polar semiconducting material, providing a buffering layer above the substrate, wherein the buffering layer includes $Al_xIn_yGa_{1-x-y}N$, where $0 \leq x < 0.5$, $0 \leq y < 0.5$, and providing a channel layer above the buffering layer. The method can further include controlling a thickness of a first portion of the channel layer, thereby creating a sidewall channel that adjoins the first portion and the rest of the channel layer, and providing a plurality of electrodes above the channel layer.

In any of the embodiments described herein, controlling the thickness of the first portion of the channel layer includes etching the first portion of the channel layer, thereby reducing the thickness of the first portion of the channel layer.

In any of the embodiments described herein, etching the first portion of the channel layer includes performing inductively coupled plasma reactive ion etching on the first portion of the channel layer.

In any of the embodiments described herein, controlling the thickness of the first portion of the channel layer includes selectively depositing a semiconductor material on the first portion of the channel layer, wherein the semiconductor material includes a material of the channel layer.

In any of the embodiments described herein, providing the buffering layer includes performing physical vapor deposition or chemical vapor deposition.

In any of the embodiments described herein, the method can further include providing an insulating layer above the channel layer before providing the plurality of electrodes.

In any of the embodiments described herein, the method can further include doping the alloy layer with a plurality of donor dopants.

Some embodiments describe an integrated device. The integrated device can include a substrate, a buffering layer disposed above the substrate, and a plurality of depletion mode devices. One of the plurality of electrodes in one of the plurality of depletion mode devices is configured to be in electrical communication with one of the plurality of electrodes in another depletion mode device.

In any of the embodiments described herein, the integrated device can further include at least one enhancement mode device, wherein one of the plurality of electrodes in one of the at least one enhancement mode device is configured to be in electrical communication with one of the plurality of electrodes in one of the plurality of depletion mode devices.

In any of the embodiments described herein, the integrated device further includes a spacer disposed between one of the plurality of depletion mode devices and one of the at least one enhancement mode device, wherein the spacer includes an insulating material to electrically isolate the channel layer of the one of depletion mode devices and the channel layer of one of the at least one enhancement mode device.

In any of the embodiments described herein, the electrodes of one of the plurality of depletion mode devices includes a first gate electrode, a first source electrode, and a first drain electrode, wherein the electrodes of one of the at least one enhancement mode device includes a second gate electrode, a second source electrode, and a second drain electrode, and wherein the first source electrode is coupled to a power supply, the first gate electrode and the first drain electrode are coupled to the second drain electrode, and the second source electrode is coupled to a ground potential.

In any of the embodiments described herein, the channel layer of the depletion mode devices and the channel layer of the enhancement mode devices include one or more of $Zn_xMg_{1-x}O$, $Al_xGa_{1-x}N$, and $Al_yIn_zGa_{1-y-z}N$, wherein $0 \leq x \leq 1$, $0 \leq y \leq 0.5$, $0 \leq z \leq 0.5$.

In any of the embodiments described herein, the channel layer of one of the plurality of the depletion mode device and the channel layer of one of the at least one enhancement mode device comprise a single semiconducting layer.

In any of the embodiments described herein, the substrate includes a non-polar or semi-polar semiconductor material.

In any of the embodiments described herein, the non-polar material or semi-polar semiconductor material includes $Al_2O_3$, ZnO, or a Group-III Nitride.

In any of the embodiments described herein, the buffering layer includes $Zn_xMg_{1-x}O$, wherein $0 \leq x < 1$, $0 \leq y < 0.5$, $0 \leq z < 0.5$.

BRIEF DESCRIPTION OF THE DRAWINGS

FIG. 9 is a cross-sectional view of "Terraced" Rotated Channel Metal Oxide/Insulator Semiconductor Transistor devices shown for a plurality of depletion mode devices monolithically linked on a common substrate and maybe further connected so as to form a circuit such as an inverter circuit or other complimentary circuits according to one embodiment and can representatively depict a similar combination of enhancement-mode devices monolithically linked on a common substrate and separated by a dielectric layer and or an implant isolation region so as to form a circuit such as an inverter circuit or other complimentary circuits according to another embodiment;

FIG. 9a is a cross-sectional view of a plurality of "Terraced" Rotated Channel Metal Oxide/Insulator Semiconductor Transistor devices shown for a plurality of depletion-mode monolithically linked on a common substrate and separated by a dielectric layer and or an implant isolation region and maybe further connected so as to form a circuit such as an inverter circuit or other complimentary circuits according to one embodiment and can representatively depict a similar combination of enhancement-mode devices monolithically linked on a common substrate and separated by a dielectric layer and or an implant isolation region so as to form a circuit such as an inverter circuit or other complimentary circuits according to another embodiment;

DETAILED DESCRIPTION

Figure 1:
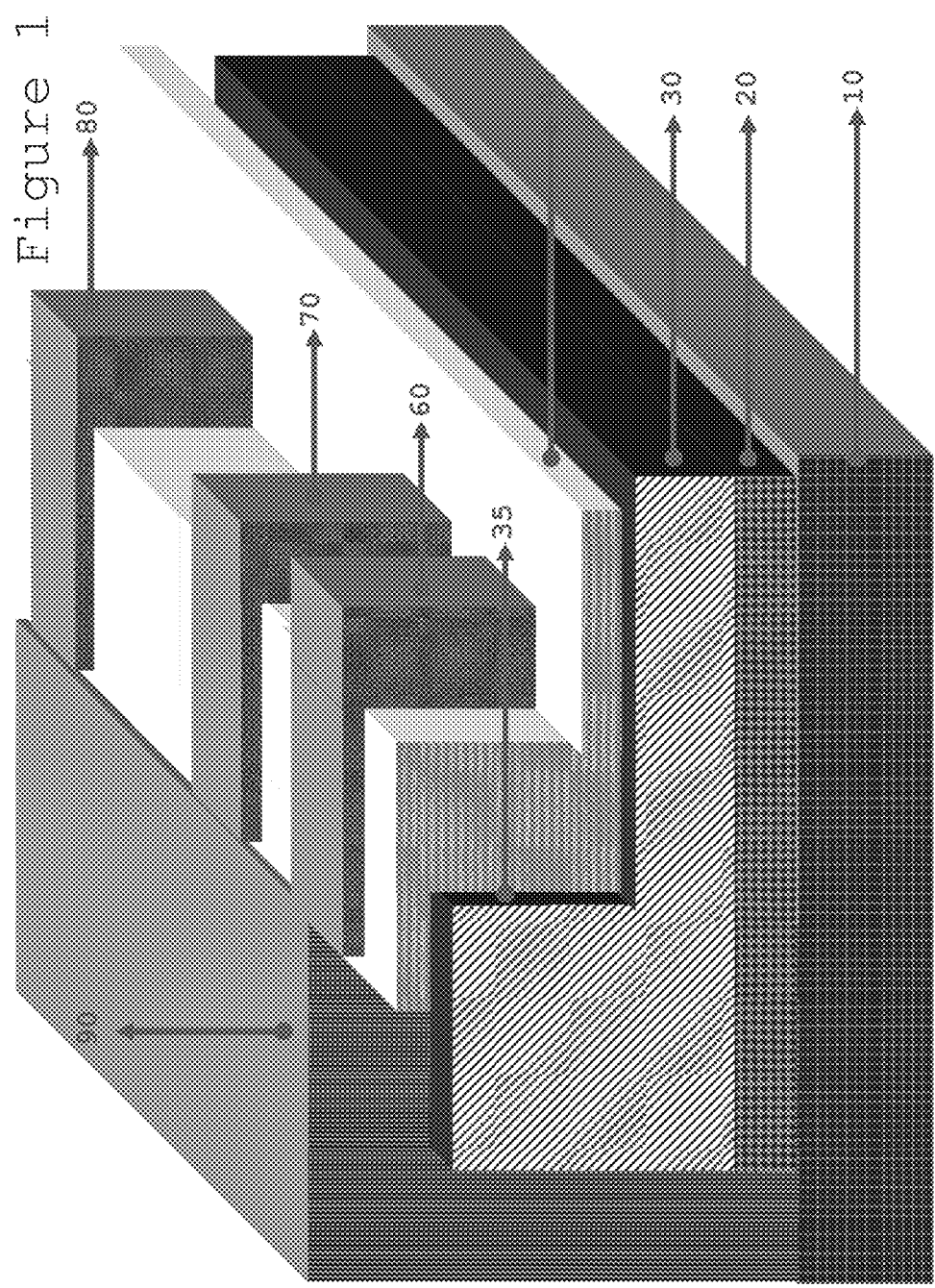
FIG. 1 is a cross-sectional view of a Rotated Channel field effect semiconductor transistor device including one or more semiconductor, and electrode layers and operating in depletion-mode according to one embodiment.
Figure 2:
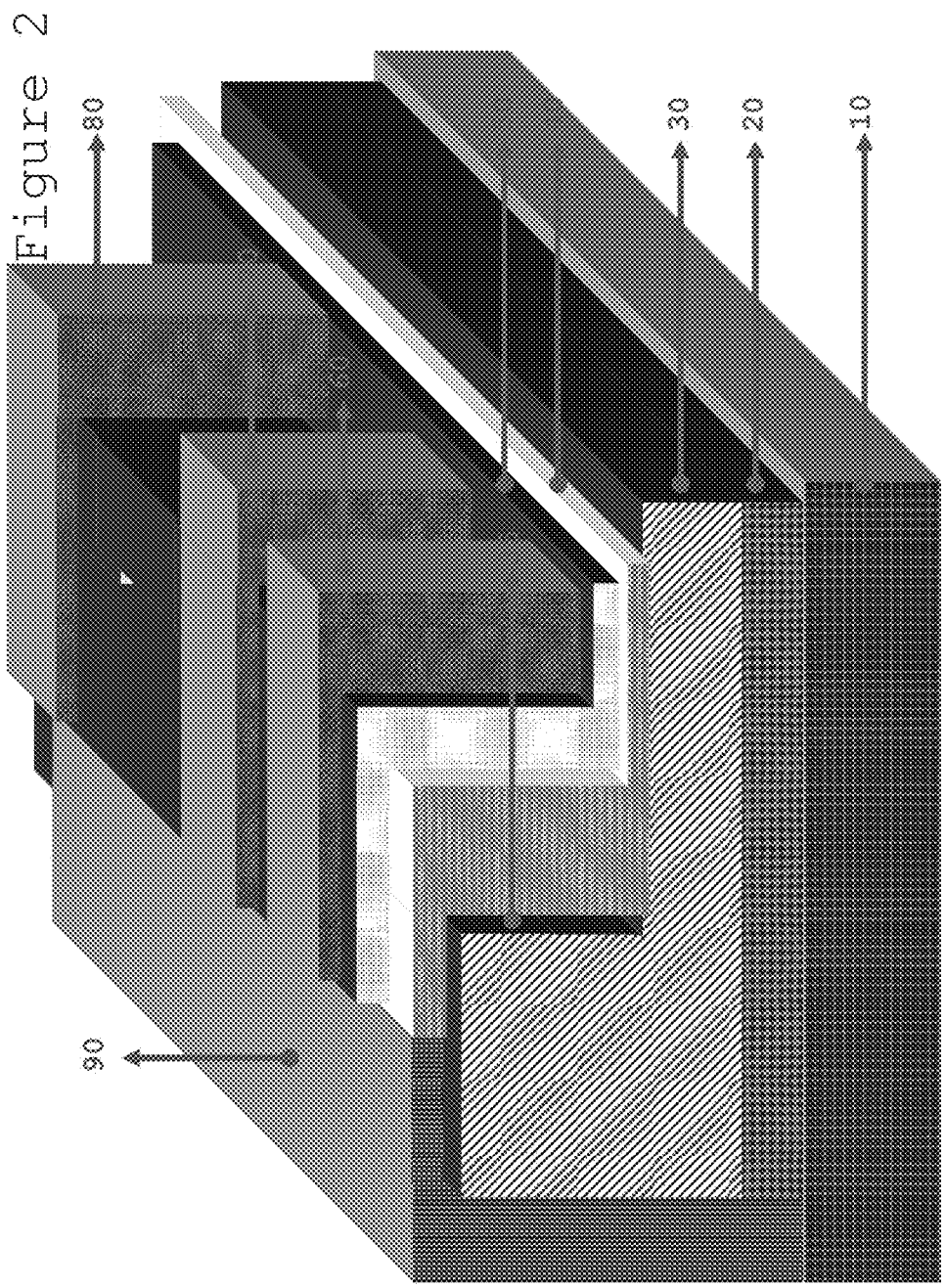
FIG. 2 is a cross-sectional view of a Rotated Channel Metal Oxide/Insulator Semiconductor Transistor device including one or more semiconductor, a dielectric, and electrode layers and operating in enhancement mode according to one embodiment.

Disclosed apparatus and method are for illustrative purposes only and is not intended to be limiting. In fact, those of ordinary skill in the art can appreciate upon reading the present specification and viewing the present drawings that various modifications and variations can be made.

Before explaining at least one embodiment in detail, it is to be understood that the disclosed apparatus and method are not limited in its application to the details of construction and to the arrangements of the components set forth in the following description or illustrated in the drawings. The disclosed apparatus and method are capable of other embodiments and of being practiced and carried out in various ways. Also, it is to be understood that the phraseology and terminology employed herein are for the purpose of description and should not be regarded as limiting. Numerous embodiments are described in this patent application, and are presented for illustrative purposes only. The described embodiments are not intended to be limiting in any sense. The disclosed apparatus and method are widely applicable to numerous embodiments, as is readily apparent from the disclosure herein. Those skilled in the art will recognize that the disclosed apparatus and method can be practiced with various modifications and alterations. Although particular features of the disclosed apparatus and method can be described with reference to one or more particular embodiments or figures, it should be understood that such features are not limited to usage in the one or more particular embodiments or figures with reference to which they are described.

As such, those skilled in the art will appreciate that the conception, upon which this disclosure is based, can readily be utilized as a basis for the designing of other structures, methods and systems. It is important, therefore, that the disclosed apparatus and method be regarded as including equivalent constructions to those described herein insofar as they do not depart from the spirit and scope of the disclosed apparatus and method.

For example, the specific sequence of the described process can be altered so that certain processes are conducted in parallel or independent, with other processes, to the extent that the processes are not dependent upon each other. Thus, the specific order of steps described herein is not to be considered implying a specific sequence of steps to perform the process. Other alterations or modifications of the above processes are also contemplated. For example, further insubstantial approximations of the process and/or algorithms are also considered within the scope of the processes described herein.

In addition, features illustrated or described as part of one embodiment can be used on other embodiments to yield a still further embodiment. Additionally, certain features can be interchanged with similar devices or features not mentioned yet which perform the same or similar functions. It is therefore intended that such modifications and variations are included within the totality of the disclosed apparatus and method.

Rotated Channel MO(I)SFET power devices and methods provided herein can alleviate some, if not many or all of the deficiencies of current power transistors including the deleterious effects of line defects. Line defects include threading dislocations orthogonally penetrating the current conduction plane, and misfit and prismatic dislocations. Rotating the current conducting channel to be parallel to traversing threading dislocations as in the intentional sidewall channel and as opposed to the conventional lateral sense dramatically reduces the density of intersecting or interpenetrating threading dislocations and enables high performance at increasing electric fields as well as concomitantly preserving the beneficial 2DEG in the crystalline plane of the current conducting channel and is further contrasted from conventional fin-FETs based on cubic or zinc blende materials such as silicon and or $In_xGa_{1-x}As$ and or $Al_xIn_{1-x}As$ and or $Al_xGa_{1-x}As$ and or $In_xGa_{1-x}P$ which are not piezoelectric materials and do not sustain a spontaneous and piezoelectric polarization effects and thus do not sustain the 2DEG on intentionally formed sidewalls.

Furthermore, the Rotated Channel MO(I)SFET increases the power density realized by device unit per unit area as there are at least two "device active" i.e. current conducting, intentional sidewalls per every lateral surface of device and thus in principle increasing the power density by at least a factor of two. For RCMOSFETs fashioned in the mesa and or terrace configuration, the integration density can be further multiplied by the number of mesas and or terraces engineered into the structure leading to a very convenient technique of drastically increasing integration density through fabrication methods. The structure of the RCMOSFET further allows the convenient fabrication and monolithic integration of other circuit components such as capacitors and more importantly inductors through the relative ease and access to a high dielectric constant substrate and epitaxial layers integrated with high dielectric constant materials as in the case of a capacitor; ready-integration of dilute magnetic nitrides and or ferromagnetic thin films such as for example $Mn_xGa_{1-x}N$ and or NiFe and or CoFe which maybe employed for planar spiral inductors. Device structures provided include one or more epitaxial layers, including one or more undoped, n-type, and or p-type doped epilayers, a dielectric layer, and or one or more electrodes. In some embodiments, the epilayers can have thicknesses ranging between about 1 μm to about 300 μm, and preferably between about 1 μm and about 15 μm.

Some transistor devices provided herein include monocrystalline layers (i.e., single crystal layers), and transistor devices provided include one or more monocrystalline epilayers. As described further herein, epilayers are realized by deposition of the layers.

In some devices described herein, $Al_2O_3$ and or AlGaInN and or ZnO-based materials can be employed to form part or the entire semiconductor portion of transistor, for example the semiconductor layers through which electrical charges are conducted. Furthermore, in some instances a non-polar or semi-polar ZnO or r-plane $Al_2O_3$ or a non-polar or semi-polar Group-III Nitride substrate can be used to provide a substrate on which semiconductor layers of the transistor can be deposited. The Group-III Nitride can include GaN and AlN. Due to potentially low lattice mismatch between for example, the non-polar or semi-polar ZnO or GaN substrate and the epitaxial layers, such a substrate can enable at the onset, the growth of low defect density monocrystalline epitaxial layers including ZnO-based epitaxial layers, and or $Al_xGa_{1-x}N$ and or $Al_yIn_zGa_{1-y-z}N$ where $0 \leq x \leq 1$, $0 \leq y \leq 0.5$, $0 \leq z \leq 0.5$ which can fundamentally enable efficient device performance as there are fewer line defects intersecting and or shorting the plane or path of current conduction. The ZnO or GaN or $Al_2O_3$ substrates can be optically transparent and, if desired, doped so as to be electrically conductive and may vary in crystal orientation to include the following orientations (10±10) m-plane non-polar materials or (11±20) a-plane non-polar materials; or (10-1±1), (20-2±1), (10-1±2), (11-2±1), (11-2±2) semipolar materials. For instances such ZnO substrate or r-plane Al$_2$O$_3$ can provide a low-cost and large surface area (greater than about one-inch diameter) substrates for ZnO-based, Al$_x$Ga$_{1-x}$N and Al$_y$In$_z$Ga$_{1-y-z}$N materials and can facilitate the production of cost effective and efficient power transistor devices.

FIGS. 1-6 and 8-9a are cross-sectional views of a Rotated Channel Semiconductor Field Effect Transistor device including one or more semiconductor layers and a substrate. In some embodiments, the substrate is ZnO based material, labeled 10 in figure, upon which a buffering layer, layer 20, comprising of semiconductor layers of ZnO based materials including but not limited to Zn$_x$Mg$_{1-x}$O and/or Zn$_x$Co$_{1-x}$O; and or Al$_x$Ga$_{1-x}$N and/or Al$_y$In$_z$Ga$_{1-z}$N based materials with $0 \leq x \leq 1$, $0 \leq y \leq 0.5$, $0 \leq z \leq 0.5$ is deposited directly onto the substrate layer 10. In some embodiments buffering layer, layer 20, can be accomplished by variety of processing techniques including physical vapor deposition techniques including but not limited to pulsed laser deposition (PLD), molecular beam epitaxy (MBE), magnetron and or direct current sputtering, and or thermal or electron beam evaporation. In some embodiments buffering layer, layer 20 can be achieved by physical vapor deposition techniques between 25° C. and 1100° C. In some embodiments buffering layer, layer 20, can be accomplished by variety of processing techniques including chemical vapor deposition techniques including but not limited to metalorganic chemical vapor deposition (MOCVD), plasma enhanced chemical vapor deposition (PECVD), metalorganic molecular beam epitaxy (MOMBE), hydride and/or halogen vapor phase epitaxy (HYPE). In some embodiments buffering layer, layer 20 can be achieved by above chemical vapor deposition techniques between 100° C. and 1100° C. In some embodiments buffering layer, layer 20, can be accomplished by variety of processing techniques including solution phase techniques including but not limited to liquid phase epitaxy (LPE), Flux growth, and Ammonothermal crystallization. In some embodiments buffering layer, layer 20 can be achieved by above solution phase techniques between 50° C. and 1100° C.

In some embodiments, a channel layer 30 comprising of Zn$_x$Mg$_{1-x}$O and/or Al$_x$Ga$_{1-x}$N and/or Al$_y$In$_z$Ga$_{1-z}$N based materials with $0 \leq x \leq 1$, $0 \leq y \leq 0.5$, $0 \leq z \leq 0.5$ where the layer 30 can vary in thickness from about 0.5 µm to about 300 µm and preferably between 0.5 µm and 15 µm is deposited. In some embodiments semiconductor layer, layer 30, maybe undoped or of N⁻ or P⁻ net carrier concentration not exceeding $10^{18}$ cm$^{-3}$. In some embodiments, the channel layer 30 can be accomplished by variety of processing techniques including physical vapor deposition techniques including but not limited to pulsed laser deposition (PLD), molecular beam epitaxy (MBE), magnetron and or direct current sputtering, and or thermal or electron beam evaporation. In some embodiments, the channel layer 30 can be achieved by physical vapor deposition techniques between 25° C. and 1100° C. In some embodiments, the channel layer 30 can be accomplished by variety of processing techniques including chemical vapor deposition techniques including but not limited to metalorganic chemical vapor deposition (MOCVD), plasma enhanced chemical vapor deposition (PECVD), metalorganic molecular beam epitaxy (MOMBE), hydride and or halogen vapor phase epitaxy (HYPE). In some embodiments, the channel layer 30 can be achieved by above chemical vapor deposition techniques between 100° C. and 1100° C. In some embodiments, the channel layer 30 can be accomplished by variety of processing techniques including solution phase techniques including but not limited to liquid phase epitaxy (LPE), Flux growth, Ammonothermal crystallization. In some embodiments semiconductor layer, layer 30 can be achieved by above solution phase techniques between 50° C. and 1100° C.

In some embodiments, the channel layer 30 includes an intentional current-conducting sidewall 35. The intentional current conducting sidewall 35 can be formed by etching the channel layer 30. The intentional current-conducting sidewall layer 35 can be accomplished by a variety of techniques including wet etching and or reactive ion etching and or inductively coupled plasma reactive ion etching and or selective area deposition to enable a profile of sufficient sidewall dimension as to form a current conducting channel for example of side wall height between about 0.5 µm and 400 µm and preferably between about 0.5 µm and 15 µm and sidewall thickness from about 0.05 µm to about 15,000 µm. In some embodiments multiple sidewalls can be achieved to form a terrace thus the terraced RCMOSFET and even further achieving ultrahigh device integration per unit area.

In some embodiments an alloy layer comprising of a Zn$_x$Mg$_{1-x}$O and/or Al$_x$Ga$_{1-x}$N and/or Al$_y$In$_z$Ga$_{1-z}$N based materials with $0 \leq x \leq 1$, $0 \leq y \leq 0.5$, $0 \leq z \leq 0.5$, layers 40 are deposited directly on the intentional current-conducting sidewall layer 35 and of thickness varying between about 0.001 µm to about 50 µm and preferably between about 0.005 µm and about 0.05 µm and with Al or In fraction preferably between 0.1 and 0.3 achieved with similar processes and temperatures as the adjacent semiconductor layer, layer 30. In some embodiments the alloy layer 40 may possess multiple sub-layers of dissimilar concentration of Al in Al$_x$Ga$_{1-x}$N and/or Al$_y$In$_z$Ga$_{1-y-z}$N based materials and/or Mg in ZnMgO alloys. In some embodiments layers 40 may possess sub-layers of dissimilar concentration of In in Al$_x$Ga$_{1-x}$N and/or Al$_y$In$_z$Ga$_{1-y-z}$N based materials and/or Mg in ZnMgO alloys. Where the concentration of Al in Al$_x$Ga$_{1-x}$N and/or Al$_y$In$_z$Ga$_{1-y-z}$N and or In in Al$_x$Ga$_{1-x}$N and/or Al$_y$In$_z$Ga$_{1-y-z}$N based materials and/or Mg in ZnMgO alloys can be used to control the sheet carrier density of the 2DEG formed on the intentional current-conducting sidewall and of thickness varying between about 0.001 µm to about 50 µm and preferably between about 0.005 µm and about 0.05 µm. In some embodiments the alloy layer 40 may possess sub-layers of different N⁻ and/or P⁻ dopant concentration within the range of $10^{15}$ cm$^{-3}$ to $10^{18}$ cm$^{-3}$. In some embodiments, N⁻ and/or P⁻ dopants maybe introduced into layer 30 and 40 by techniques including gas phase incorporation and/or ion implantation and/or solution incorporation.

In some embodiments layers 30 and 40, maybe implanted with elements from group VIII of the periodic table thus forming an isolation layer, layer 55. In some embodiments such as for example in FIG. 2, an additional dielectric layer, layer 50, is deposited on top of and adjacent to layer 40. In some embodiments layer 50 is an insulating layer, of a dielectric material of composition A$_x$B$_{1-x}$O$_y$ and or A$_x$B$_{1-x}$N$_y$ where A maybe selected from a group comprising of Al, Ga, La, Hf, Sc and B may be selected from a group consisting of Si, Zr, Zn, Ga and Sr and where $0 \leq x \leq 1$ and whereupon the dielectric layer, layer 50, allows for the field effect to bear upon the 2DEG sustained along the intentional current-conducting layer 35 and at the interface of layers 30 and 40 and whereupon layer 50 maybe of thickness varying between about 0.001 µm to about 50 µm and preferably between about 0.005 µm and about 0.05 µm. In some embodiments, an electrode materials comprising of metals and or poly-silicon, and or indium tin oxide, and or zinc gallium oxide, and/or zinc indium oxide, and or zinc aluminum oxide, layer 60, maybe deposited directly onto layer 40 or maybe deposited directly onto layer 50 and known as the source electrodes. In some embodiments additional electrode, layer 70, maybe deposited directly on semiconductor layer 40 or layer 50 and known as the gate electrode. In some embodiments, additional electrodes, layer 80, can be deposited maybe deposited directly on semiconductor layers 40 or maybe deposited directly onto layer 50 and known as the drain electrode. In some embodiments, a passivating layer, comprising of an oxide, and or nitride, and or oxynitride and or a halogenated polymer, layer 90, is deposited around the semiconductor materials and or electrodes.

In some embodiments, layer 10 can be doped n-type. In some embodiments, layer 10 may comprise of n-type impurities between $10^{14}$ cm$^{-3}$ and $10^{21}$ cm$^{-3}$. In some embodiments, layer 10 may possess n-type resistivity from $10^6$ Ω-cm to $10^{-3}$ Ω-cm.

In some embodiments, layer 10 can be doped p-type. In some embodiments, layer 10 may comprise of p-type impurities between $10^{14}$ cm$^{-3}$ to $10^{21}$ cm$^{-3}$. In some embodiments, layer 10 may possess p-type resistivity from $10^6$ Ω-cm to $10^{-3}$ Ω-cm.

In some embodiments, layer 20 may be undoped or doped n-type between $10^{14}$ cm$^{-3}$ to $10^{21}$ cm$^{-3}$ and may possess resistivity from $10^5$ Ω-cm to $10^{-4}$ Ω-cm.

In some embodiments, layer 20 may be undoped or doped p-type with p-type dopants between $10^{14}$ cm$^{-3}$ to $10^{21}$ cm$^{-3}$ and may possess resistivity from $10^5$ Ω-cm to $10^{-3}$ Ω-cm.

In some embodiments, layer 30 can be undoped or intrinsic or may be doped n-type with donor dopant concentration between $10^{14}$ cm$^{-3}$ and $10^{21}$ cm$^{-3}$ or may be p-type doped with acceptor concentration between $10^{14}$ cm$^{-3}$ to $10^{21}$ cm$^{-3}$. In some embodiments, layer 30 may possess n-type or p-type resistivity from $10^6$ Ω-cm to $10^{-3}$ Ω-cm.

In some embodiments, layer 40 maybe undoped or n-type doped and with resistivity from $10^6$ Ω-cm to $10^{-4}$ Ω-cm. In some embodiments, layer 40 and layer 50 may possess p-type resistivity from $10^6$ Ω-cm to $10^{-3}$ Ω-cm.

In some embodiments, drain and source electrodes, layers 60 and 80 may be selected from a group comprising of metals or metal stacks including Al, Pt, Au, Si, Ti, W, Cu, Ti/Au, Ti/Al, Ti/Al/Au, Ti/Al/Pt/Au, Cr/Au, Cr/Al, Cr/Al/Au, Al/Au, Al, Al/Pt, In, Ru and or a group comprising of metals or metal stacks including Cr, and/or NiO and/or polysilicon and/or Ni/Al/Au, Ni/Ti/Au, Pt/Au, Pt, Au, Ag or any combination of the foregoing to form electrical contact to the underlying semiconductor layers.

In some embodiments, layer 70, the gate electrode may be selected from a group comprising of metals or metal stacks including Ti/Au, Ti/Al, Ti/Al/Au, Ti/Al/Pt/Au, Cr/Au, Cr/Al, Cr/Al/Au, Al/Au, Al, Al/Pt, In, Ru and or a group comprising of metals or metal stacks including Cr, and/or polysilicon NiO and or Ni/Al/Au, Ni/Ti/Au, Pt/Au, Pt, Au, Ag or any combination of the foregoing to form electrical contact to the underlying semiconductor layers.

Figure 3:
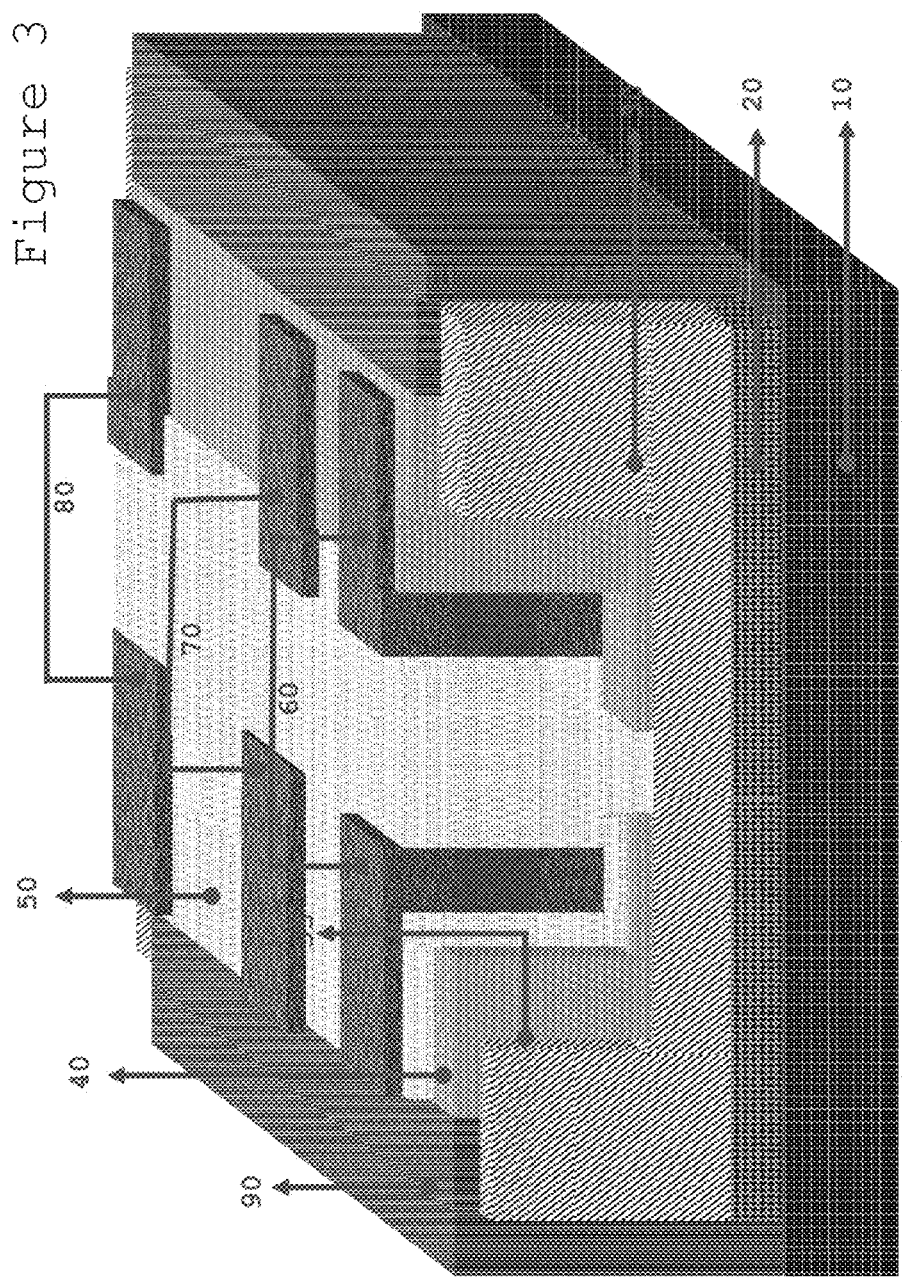
FIG. 3 is a cross-sectional view of a Rotated Channel Metal Oxide/Insulator semiconductor transistor device in enhancement mode monolithically linked with a Rotated Channel Field Effect Semiconductor Transistor in depletion mode on a common substrate and separated by a dielectric layer according to one embodiment.

In some embodiment such as in FIG. 3, a plurality of RC-MO(I)SFET linked together may be a combination of enhancement and depletion mode devices wherein the enhancement mode devices requires an increasingly positive bias to allow current flow across the current conducting sidewall channel and the depletion mode device requires an increasing negative bias to inhibit current flow across the current conducting sidewall channel and wherein the two device regions are separated by a field insulator such as a field dielectric of for example, silicon oxide.

Figure 4:
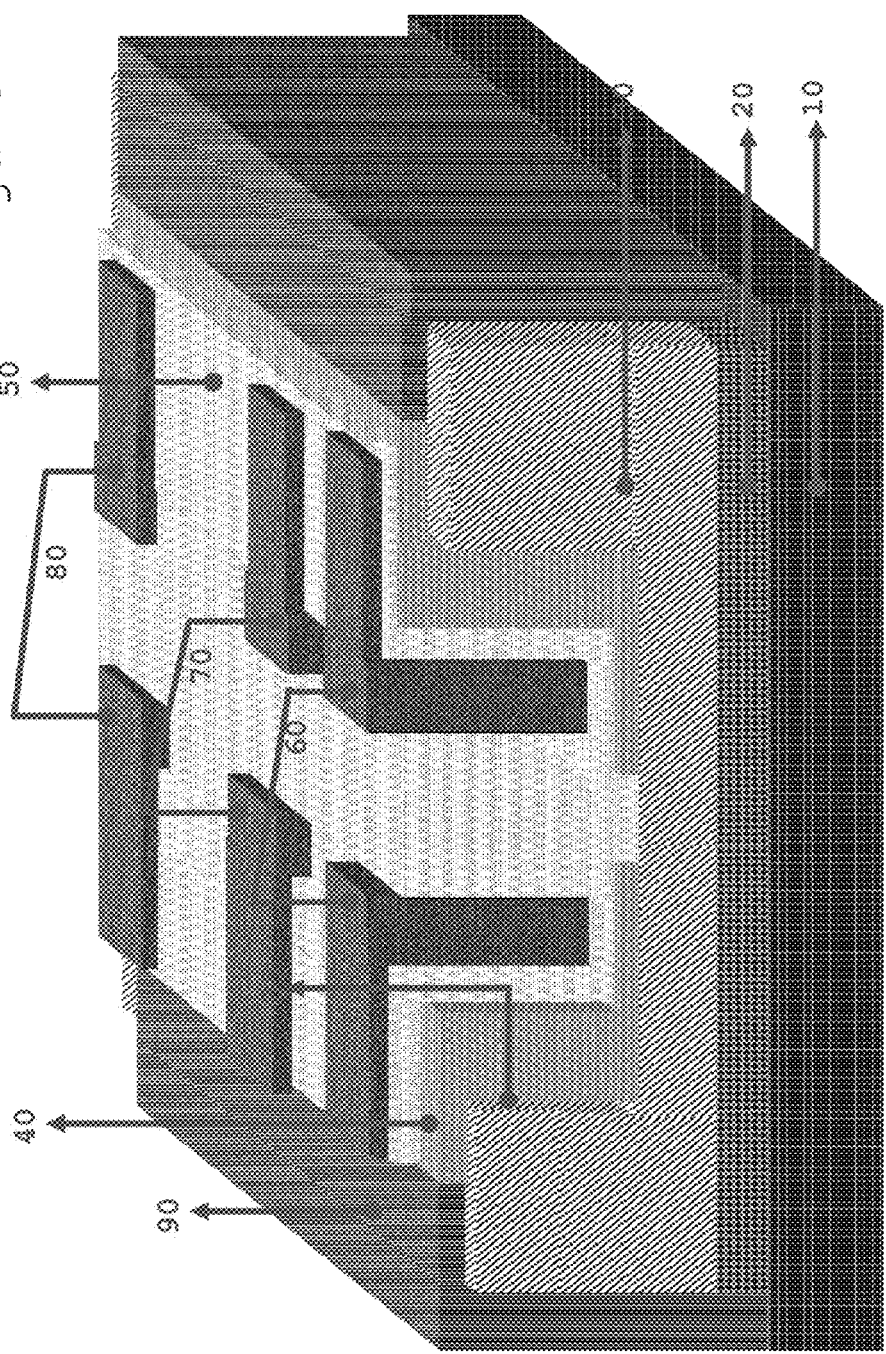
FIG. 4 is a cross-sectional view of more than one Rotated Channel Metal Oxide/Insulator Semiconductor Transistor devices in enhancement-mode monolithically linked on a common substrate and separated by a dielectric layer according to one embodiment.

In some embodiment such as in FIG. 4, a plurality of RC-MO(I)SFET linked together may be a combination of enhancement mode devices wherein the enhancement mode devices requires an increasingly positive bias to allow current flow across the current conducting sidewall channel and wherein the two device regions are separated by a field insulator such as a field dielectric of for example, silicon oxide.

Figure 5:
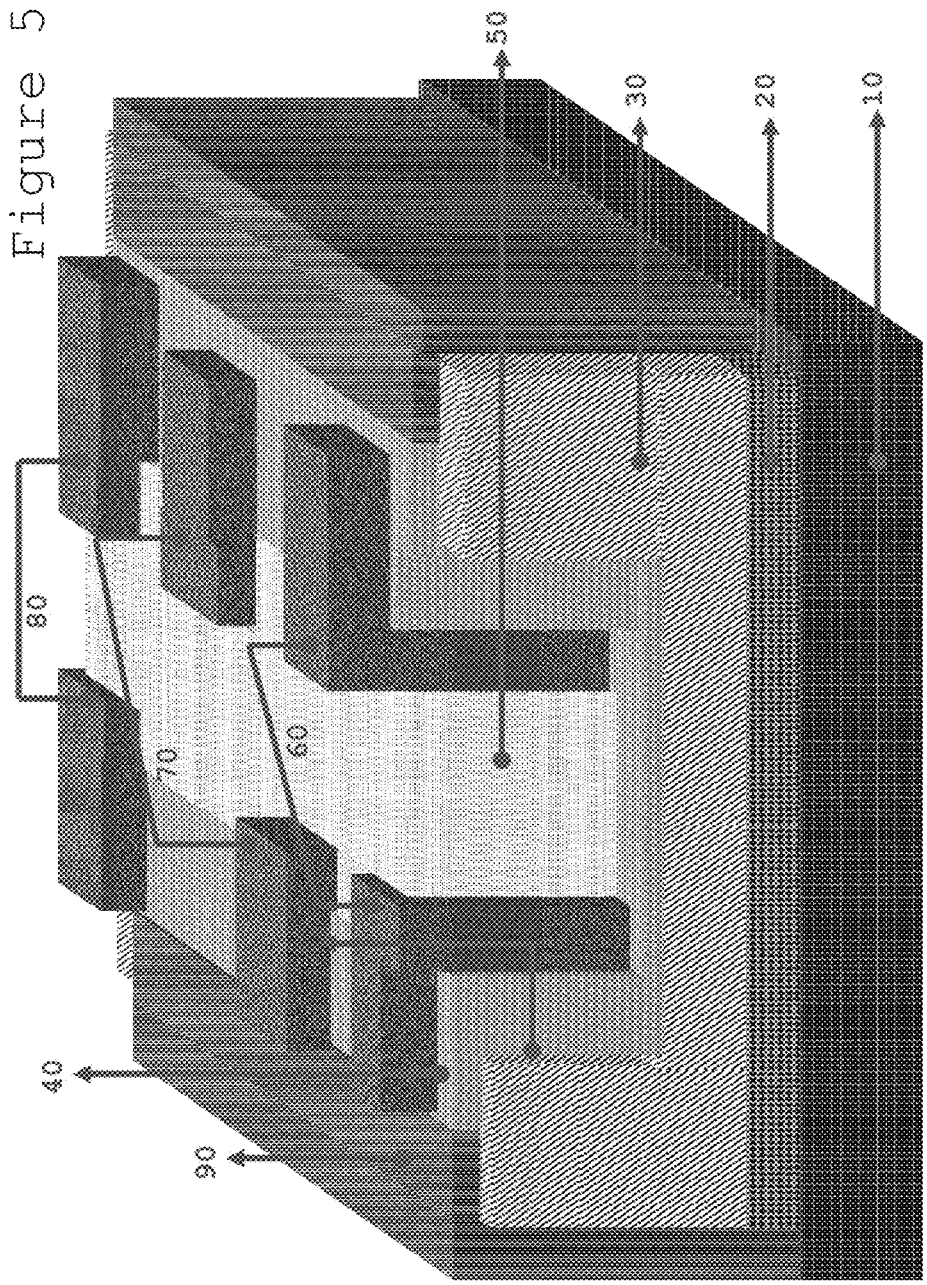
FIG. 5 is a cross-sectional view of more than one Rotated Channel Metal Oxide/Insulator Semiconductor Transistor devices in depletion mode monolithically linked on a common substrate and separated by a dielectric layer and an implant isolation region according to one embodiment.

In some embodiment such as in FIG. 5, a plurality of RC-MO(I)SFET linked together may be a combination of depletion mode devices wherein the depletion mode devices requires an increasingly negative bias to inhibit current flow across the current conducting sidewall channel and wherein the two device regions are separated by a field insulator such as a field dielectric of for example, silicon oxide.

Figure 6:
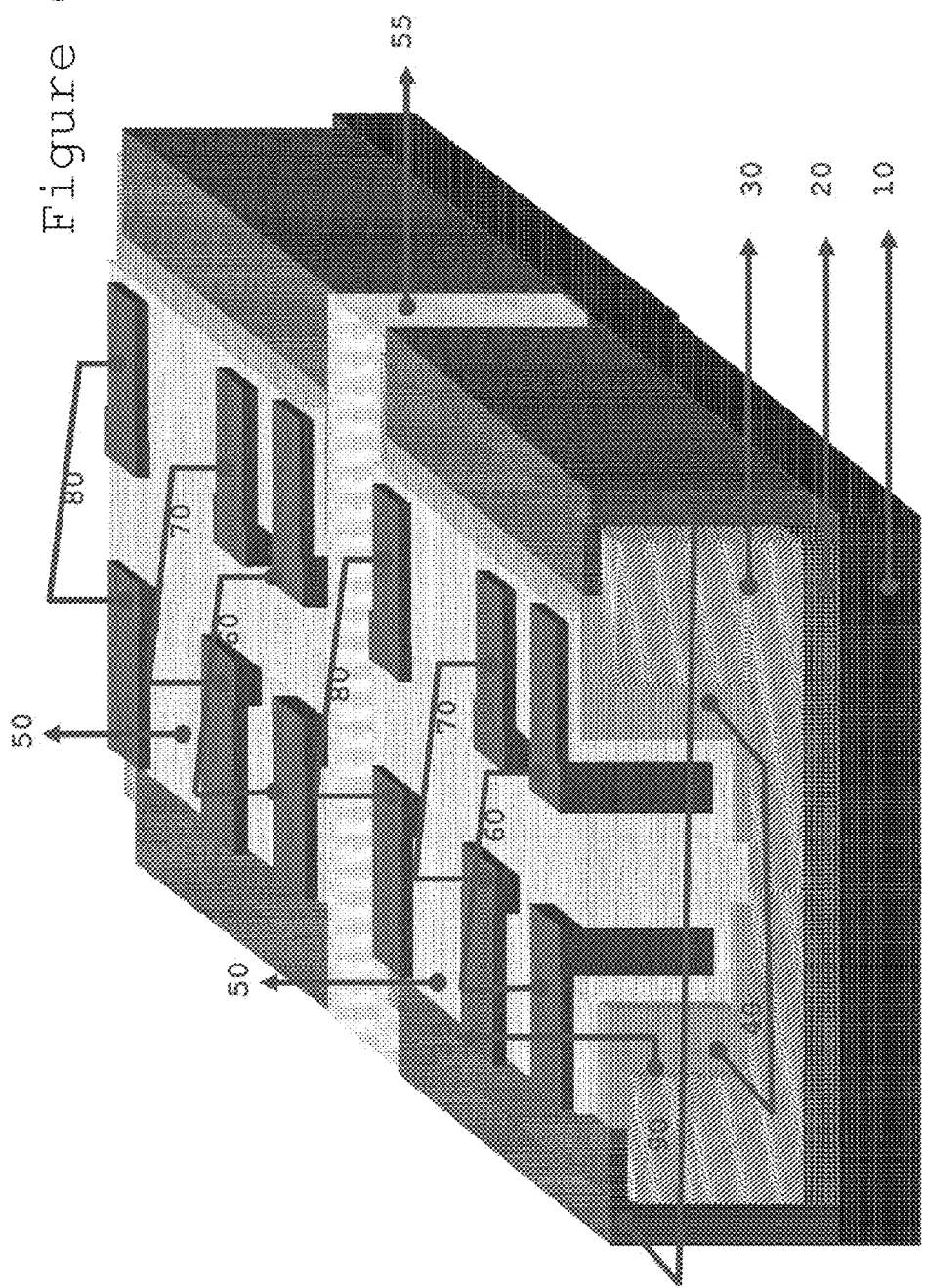
FIG. 6 is a cross-sectional view of a plurality of Rotated Channel Metal Oxide/Insulator Semiconductor Transistor devices shown for a combinations of enhancement-mode monolithically linked on a common substrate and separated by a dielectric layer and or an implant isolation region so as to form a circuit such as an inverter circuit or other complimentary circuits according to one embodiment and can representatively depict a combinations of depletion-mode monolithically linked on a common substrate and separated by a dielectric layer and or an implant isolation region so as to form a circuit such as an inverter circuit or other complimentary circuits according to another embodiment.
Figure 7:
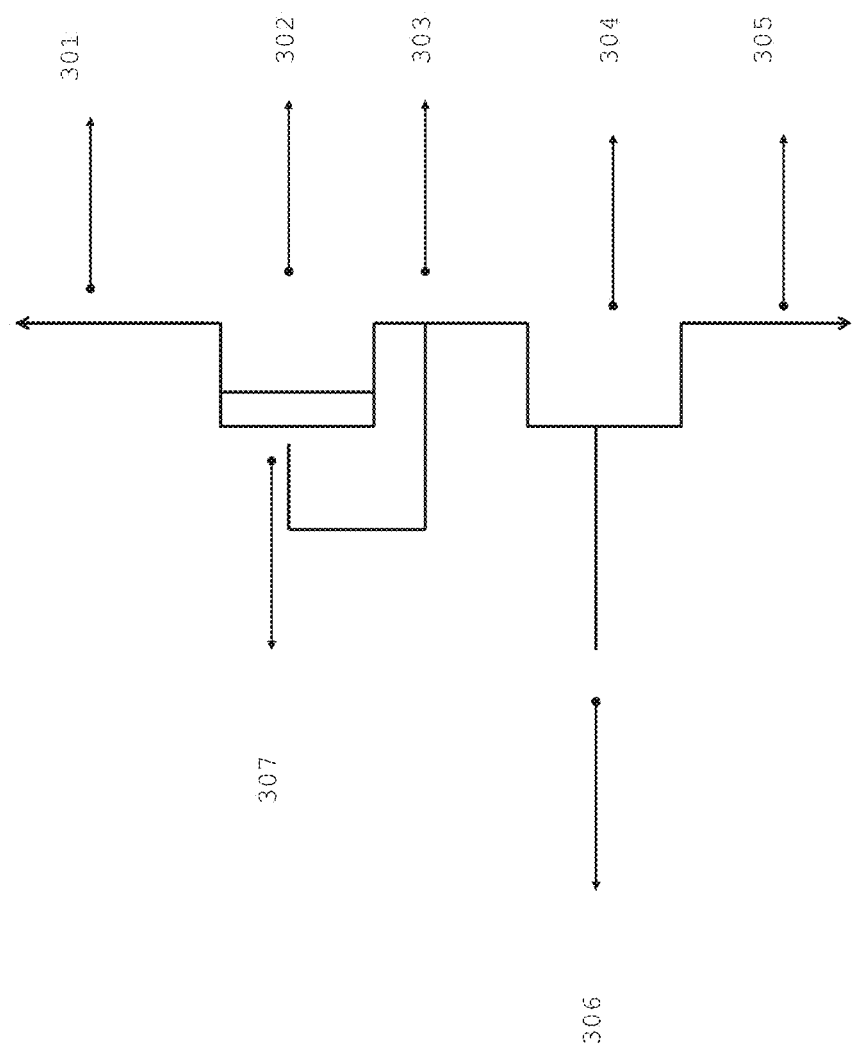
FIG. 7 is a topological representation of an example inverter circuit from through the monolithic integration and combination of transistor devices described according to one embodiment.
Figure 8:
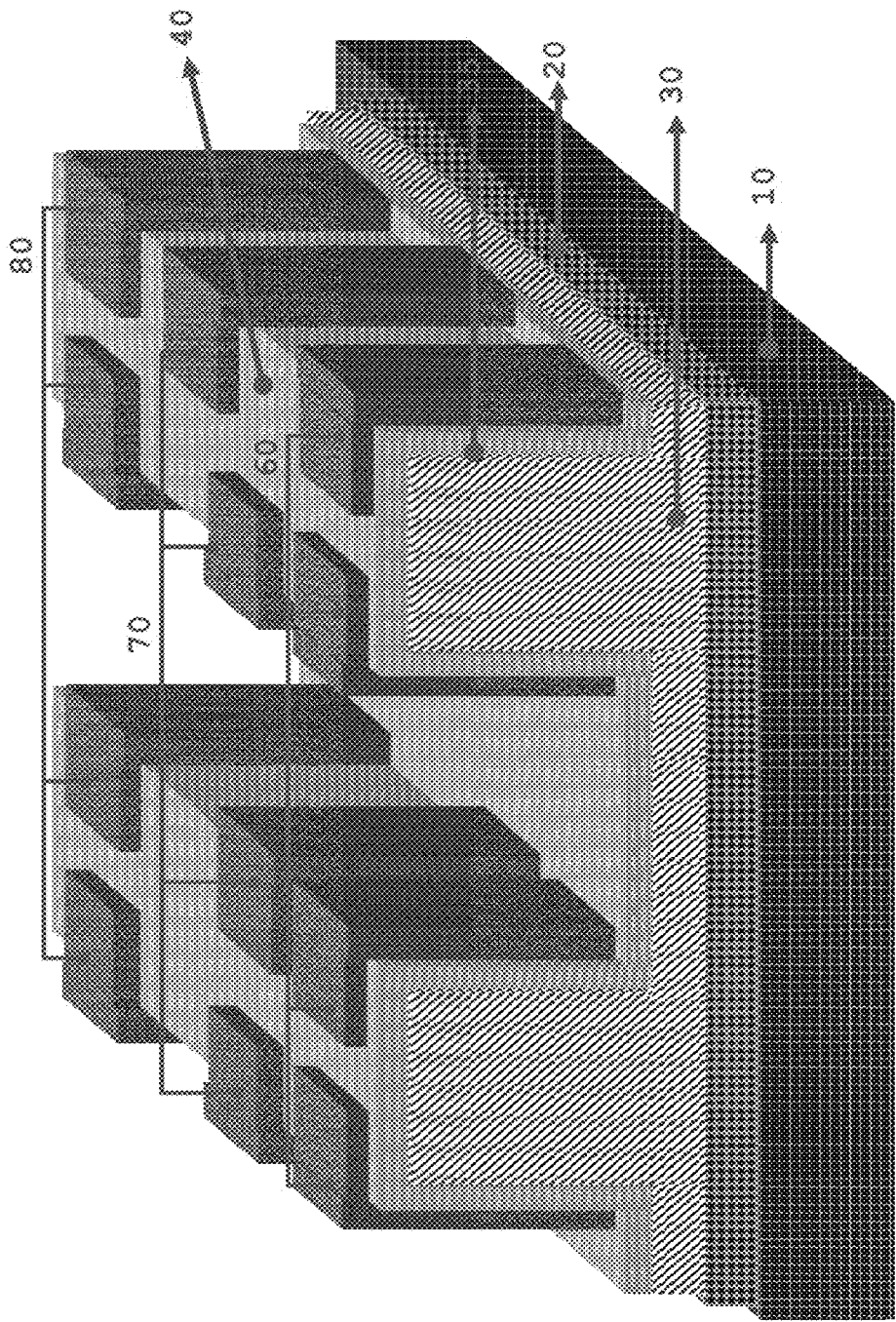
FIG. 8 is a cross-sectional view of a plurality of Rotated Channel Metal Oxide/Insulator Semiconductor Transistor devices comprising of device active mesas shown for a combination of depletion-mode devices monolithically linked on a common substrate and maybe further connected so as to form a circuit such as an inverter circuit or other complimentary circuits according to one embodiment and can representatively depict a similar combination of enhancement-mode devices monolithically linked on a common substrate and separated by a dielectric layer and or an implant isolation region so as to form a circuit such as an inverter circuit or other complimentary circuits according to another embodiment.
Figure 8A:
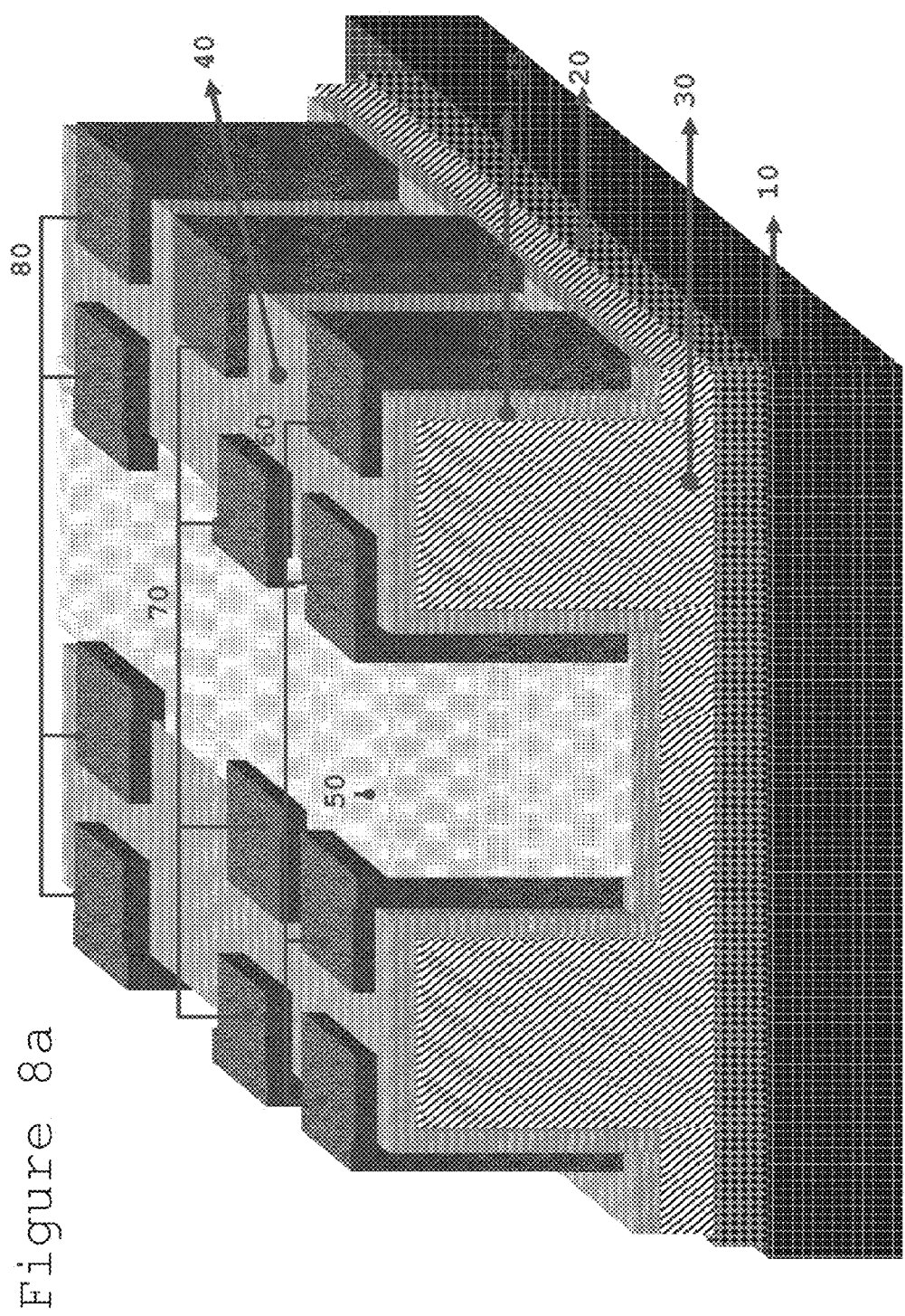
FIG. 8a is a cross-sectional view of a plurality of Rotated Channel Metal Oxide/Insulator Semiconductor Transistor devices comprising of device active mesas shown for a combination of depletion-mode monolithically linked on a common substrate and separated by a dielectric layer and or an implant isolation region and maybe further connected so as to form a circuit such as an inverter circuit or other complimentary circuits according to one embodiment and can representatively depict a similar combination of enhancement-mode devices monolithically linked on a common substrate and separated by a dielectric layer and or an implant isolation region so as to form a circuit such as an inverter circuit or other complimentary circuits according to another embodiment.

In some embodiment such as in FIG. 6, a plurality of RC-MO(I)SFET linked together may be a combination of enhancement and depletion mode devices wherein the enhancement mode devices requires an increasingly positive bias to allow current flow across the current conducting sidewall channel and the depletion mode device requires an increasing negative bias to inhibit current flow across the current conducting sidewall channel and wherein the multiple device regions are separated by a field insulator such as a field dielectric of for example, silicon oxide and or a region implanted with heavy elements such as from group VIII of the periodic table of elements as to form circuits, such an inverter, or other logic and/or complimentary circuits as shown, for example, in the cross-section of FIG. 6 and circuit topology of FIG. 7 wherein 301 labels the high voltage potential and source of the depletion mode device, typically set to a potential of 0 to 100 V, 305 labels the low voltage potential and source of the enhancement mode device, typically set to a potential of 0 to −100 V, 306 labels the digital input node and gate of the enhancement mode device, 303 labels the digital output node, drain of the enhancement mode device, and drain of the depletion mode device, 307 labels the gate of the depletion mode device, 302 labels the depletion mode device, 304 labels the enhancement mode device, where the depletion mode device and enhancement mode device are formed on the same substrate.

As used herein, when a structure (e.g., layer, region) is referred to as being "on", "over" "overlying" or "supported by" another structure, it can be directly on the structure, or an intervening structure (e.g., layer, region) also can be present. A structure that is "directly on" or "in contact with" another structure means that no intervening structure is present. A structure that is "directly under" another structure means that no intervening structure is present.

The terms "including", "having," "comprising" and variations thereof mean "including but not limited to", unless expressly specified otherwise.

The term "consisting of"and variations thereof mean "including and limited to", unless expressly specified otherwise.

The enumerated listing of items does not imply that any or all of the items are mutually exclusive. The enumerated listing of items does not imply that any or all of the items are collectively exhaustive of anything, unless expressly specified otherwise. The enumerated listing of items does not imply that the items are ordered in any manner according to the order in which they are enumerated.

The terms "a", "an" and "the" mean "one or more", unless expressly specified otherwise.

Headings of sections provided in this patent application and the title of this patent application are for convenience only, and are not to be taken as limiting the disclosure in any way.

Having thus described several aspects of at least one embodiment, it is to be appreciated various alterations, modifications, and improvements will readily occur to those skilled in the art. Such alterations, modifications, and improvements are intended to be part of this disclosure, and are intended to be within the spirit and scope of the disclosed apparatus and method. Accordingly, the foregoing description and drawings are by way of example only.

What is claimed is:

1. A semiconductor device comprising:
a substrate;
a buffering layer disposed above the substrate;
a channel layer having a first portion and a second portion, wherein the first portion has a first thickness and the second portion has a second thickness, and wherein a wall adjoining the first portion and the second portion includes a sidewall channel;
a plurality of electrodes configured to be in electrical communication with the sidewall channel, wherein the plurality of electrodes is configured to receive voltages to provide a controlled current flow through the semiconductor device; and
an alloy layer disposed between the channel layer and the plurality of electrodes, wherein the alloy layer is configured to provide control of the sidewall channel's sheet carrier density.

2. The semiconductor device of claim 1, wherein the channel layer includes one or more of $Zn_xMg_{1-x}O$, $Al_xGa_{1-x}N$, and $Al_yIn_zGa_{1-y-z}N$, wherein $0 \le x \le 1$, $0 \le y \le 0.5$, $0 \le z \le 0.5$.

3. The semiconductor device of claim 1, wherein the substrate includes a non-polar or semi-polar semiconductor material.

4. The semiconductor device of claim 3, wherein the non-polar material or semi-polar semiconductor material includes $Al_2O_3$, ZnO, or a Group-III Nitride.

5. The semiconductor device of claim 3, wherein the sidewall channel is configured to accommodate a two dimensional electron gas formed by a piezo polarization of the channel layer.

6. The semiconductor device of claim 1, wherein the sidewall channel is substantially perpendicular to the first portion and the second portion of the channel layer.

7. The semiconductor device of claim 1, wherein the sidewall channel is configured to substantially avoid crystalline defects of the channel layer.

8. The semiconductor device of claim 7, wherein the crystalline defects of the channel layer include threading dislocations, and misfit and prismatic dislocations.

9. The semiconductor device of claim 1, wherein the alloy layer includes a plurality of sub-layers, each sub-layer having a dissimilar concentration of aluminum from other sub-layers.

10. The semiconductor device of claim 1, wherein the alloy layer includes a plurality of sub-layers, each sub-layer having a dissimilar concentration of indium from other sub-layers.

11. The semiconductor device of claim 1, wherein the alloy layer includes $Zn_xMg_{1-x}O$, $Al_xGa_{1-x}N$, or $Al_yIn_zGa_{1-z}N$, wherein $0 \le x \le 1$, $0 \le y \le 0.5$, $0 \le z \le 0.5$.

12. The semiconductor device of claim 1, wherein the buffering layer includes $Zn_xMg_1O$, wherein $0 \le x < 1$.

13. An integrated device comprising:
a substrate;
a buffering layer disposed above the substrate; and
a plurality of depletion mode devices, wherein at least one of the plurality of depletion mode device comprises:
a channel layer having a first portion and a second portion, wherein the first portion has a first thickness and the second portion has a second thickness, and wherein a wall adjoining the first portion and the second portion includes a sidewall channel; and
a plurality of electrodes configured to be in electrical communication with the sidewall channel, wherein the plurality of electrodes is configured to receive voltages to provide a controlled current flow through the depletion mode device; and
an alloy layer disposed between the channel layer and the plurality of electrodes, wherein the alloy layer is configured to provide control of the sidewall channel's sheet carrier density;
wherein one of the plurality of electrodes in one of the plurality of depletion mode devices is configured to be in electrical communication with one of the plurality of electrodes in another depletion mode device.

14. The integrated device of claim 13, wherein the electrodes of one of the plurality of depletion mode devices includes a first gate electrode, a first source electrode, and a first drain electrode, wherein the electrodes of one of the at least one enhancement mode device includes a second gate electrode, a second source electrode, and a second drain electrode, and wherein the first source electrode is coupled to a power supply, the first gate electrode and the first drain electrode are coupled to the second drain electrode, and the second source electrode is coupled to a ground potential.

15. The integrated device of claim 13, wherein the channel layer of the depletion mode devices and the channel layer of the enhancement mode devices include one or more of $Zn_xMg_{1-x}O$, $Al_xGa_{1-x}N$, and $Al_yIn_zGa_{1-y-z}N$, wherein $0 \le x \le 1$, $0 \le y \le 0.5$, $0 \le z \le 0.5$.

16. The integrated device of claim 13, wherein the substrate includes a non-polar or semi-polar semiconductor material.

17. The integrated device of claim 16, wherein the non-polar material or semi-polar semiconductor material includes $Al_2O_3$, ZnO, or a Group-III Nitride.

18. The integrated device of claim 13, wherein the buffering layer includes $Zn_xMg_{1-x}O$, wherein $0 \le x \le 1$.

* * * * *